US006990648B2

(12) United States Patent
Palumbo

(10) Patent No.: US 6,990,648 B2
(45) Date of Patent: Jan. 24, 2006

(54) METHOD FOR IDENTIFICATION OF SUB-OPTIMALLY PLACED CIRCUITS

(75) Inventor: Joseph J. Palumbo, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 364 days.

(21) Appl. No.: 10/408,203

(22) Filed: Apr. 4, 2003

(65) Prior Publication Data

US 2004/0199883 A1 Oct. 7, 2004

(51) Int. Cl.
*G06F 17/50* (2006.01)

(52) U.S. Cl. .................... 716/9; 716/10; 716/5; 716/7; 716/2

(58) Field of Classification Search .................... 716/9, 716/10, 5, 7, 2
See application file for complete search history.

(56) References Cited

U.S. PATENT DOCUMENTS

| | | | | |
|---|---|---|---|---|
| 5,587,923 | A * | 12/1996 | Wang | 716/13 |
| 5,673,201 | A * | 9/1997 | Malm et al. | 716/12 |
| 5,784,289 | A * | 7/1998 | Wang | 716/8 |
| 5,859,781 | A * | 1/1999 | D'Haeseleer et al. | 716/8 |
| 5,875,117 | A * | 2/1999 | Jones et al. | 716/14 |
| 5,903,461 | A * | 5/1999 | Rostoker et al. | 700/121 |
| 5,930,499 | A * | 7/1999 | Chen et al. | 716/8 |
| 5,984,510 | A * | 11/1999 | Guruswamy et al. | 716/2 |
| 6,123,736 | A * | 9/2000 | Pavisic et al. | 716/2 |
| 6,292,929 | B2 * | 9/2001 | Scepanovic et al. | 716/14 |
| 6,301,693 | B1 * | 10/2001 | Naylor et al. | 716/10 |
| 6,353,918 | B1 * | 3/2002 | Carothers et al. | 716/8 |
| 6,415,427 | B2 * | 7/2002 | Nitta et al. | 716/10 |
| 6,493,658 | B1 * | 12/2002 | Koford et al. | 703/1 |
| 6,557,145 | B2 * | 4/2003 | Boyle et al. | 716/2 |
| 6,609,243 | B1 * | 8/2003 | Evans et al. | 716/16 |
| 6,637,016 | B1 * | 10/2003 | Gasanov et al. | 716/12 |
| 6,671,859 | B1 * | 12/2003 | Naylor et al. | 716/2 |

(Continued)

FOREIGN PATENT DOCUMENTS

JP 03074873 A * 3/1991

OTHER PUBLICATIONS

Frezza et al., "SPAR: a schematic place and route system", IEEE Transactions on Computer-Aided Design of Integrated Circuits and Systems, vol. 12, No. 7, Jul. 1993, pp. 956-973.*

(Continued)

*Primary Examiner*—Matthew Smith
*Assistant Examiner*—Phallaka Kik
(74) *Attorney, Agent, or Firm*—Lynn L. Augspurger

(57) ABSTRACT

A method for identifying, in a VLSI chip design, circuits placed in an region of wiring congestion which can be replaced such that wiring tracks are freed up due to decreased net lengths without any pin to pin segment increasing in length. Circuits placed within the region of wiring congestion are identified and examined to determine the circuits they connect to. The placements of the connected circuits are analyzed to derive a rectangle of connectivity. Each of the originally identified circuits are then checked to determine if they are placed within their associated rectangle of connectivity. If not, the distance between the circuit and rectangle is calculated along with a recommended placement location, both of which are reported along with the circuit. The recommended placement location is a point along the border of the rectangle such that replacement of the circuit at the location reduces all circuit net lengths without increasing any pin to pin segment. In this way, wiring tracks are freed up without any potential for increased path delays.

8 Claims, 3 Drawing Sheets

U.S. PATENT DOCUMENTS

| | | | | |
|---|---|---|---|---|
| 6,766,500 | B1 * | 7/2004 | Donelly et al. | 716/10 |
| 6,832,362 | B2 * | 12/2004 | Nuber | 716/12 |
| 6,904,585 | B2 * | 6/2005 | Brittain et al. | 716/13 |
| 6,912,704 | B1 * | 6/2005 | Teig | 716/10 |
| 2001/0018759 | A1 * | 8/2001 | Andreev et al. | 716/7 |
| 2003/0018947 | A1 * | 1/2003 | Tieg et al. | 716/7 |
| 2003/0229878 | A1 * | 12/2003 | Nuber | 716/17 |
| 2004/0040007 | A1 * | 2/2004 | Harn | 716/11 |
| 2004/0078770 | A1 * | 4/2004 | Miller et al. | 716/10 |

OTHER PUBLICATIONS

Kastner et al., "Pattern routing: use and theory for increasing predictability and avoiding coupling", IEEE Transactions on Computer-Aided Design of Integrated Circuits and Systems, vol. 21, No. 7, Jul. 2002, pp. 777-790.*

Sham et al., "Routability-driven floorplanner with buffer block planning", IEEE Transactions on Computer-Aided Design of Integrated Circuits and Systems, vol. 22, No. 4, Apr. 2, 2003, pp. 470-480.*

Wang et al., "Modeling and minimization of routing congestion", Proceedings of the ASP-DAC 2000 Asia and South Pacific Design Automation Conference, Jan. 25, 2000, pp. 185-190.*

Krishna et al., "Technique for planning of terminal locations of leaf cells in cell-based design with routing considerations", 1998 Proceedings of Eleventh International Conference on VLSI Design, Jan. 4, 1998, pp. 53-58.*

Wang et al., "Congestion minimization during placement", IEEE Transactions on Computer-Aided Design of Integrated Circuits and Systems, vol. 19, No. 10, Oct. 2000, pp. 1140-1148.*

* cited by examiner

METHOD FOR IDENTIFICATION OF SUB-OPTIMALLY PLACED CIRCUITS

FIELD OF THE INVENTION

This invention relates to the physical design process of designing VLSI semiconductor chips, and particularly is directed at the alleviation of wiring congestion.

Trademarks: IBM® is a registered trademark of International Business Machines Corporation, Armonk, N.Y. U.S.A. S/390, z900 and z990 and other product names may be registered trademarks or product names of International Business Machines Corporation or other companies.

BACKGROUND

Wiring congestion in an area of a semiconductor chip can have an adverse impact on timing due to longer than minimum (non-steiner) wire lengths causing larger than necessary wire and circuit delays. Ideally, the placement of an individual circuit should be somewhere between the circuit(s) that drives it and the circuit(s) that it drives. This eliminates the needless consumption of wiring tracks due to cross wiring along the path. Typically, automated placement programs are driven by metrics that result in this condition. However, subsequent steps in the physical design process, such as replication of clock network circuits followed by placement legalization, can lead to situations where circuits are moved outside of their area of connectivity. Steps to replace a particular region to alleviate wiring congestion may negate prior logical or physical design modifications made to improve timing. U.S. Pat. No. 5,859,781 for a "Method and Apparatus For Computing Minimum Wire-length Position (MWP) For Cell in Cell Placement for Integrated Circuit Chip", describes a method for optimizing the placement of circuits in order to minimize total wire length by employing bounding boxes of connectivity for each net connected to a circuit. Although this is adequate from a pure wirability viewpoint, one drawback is that not all net segments have an equal relationship to timing. Particularly in a design that has gone through some level of logic optimization based on physical design parameters, such as those described in U.S. Pat. No. 6,192,508, "Method For Logic Optimization For Improved Timing and Congestion During Placement In Integrated Circuit Design", longer length nets have probably already had the circuit driving them bumped up in strength while shorter lengths potentially have smaller/weaker circuits driving them. In this case, decreasing the total net length of a set of nets at the expense of increasing certain pin to pin segments could have an adverse impact on timing. This is illustrated by the two examples shown in FIG. 1. For circuit D1, a placement move to the left will decrease total net length as both nets IN1B and IN2B are reduced by the same length that net OUT1B is increased. However, if circuit D1 is a weak strength circuit, the delay increase due to the longer length of net OUT1B is likely to outweigh the delay decrease due to the shorter lengths of nets IN1B and IN2B, creating a potential timing problem. Even in the case where no net lengths increase, there can still be a timing impact due to an increased pin to pin connection. A placement move to the left for circuit B1 in the figure will decrease the net lengths of nets IN1A and OUT1A and net IN2A's length will remain the same. However, the pin to pin length from A2 to B1 will increase, potentially leading to a larger path delay if the delay of circuit B1 is particularly sensitive to input slew and/or if the magnitude of increase in wire delay from A2 to B1 is greater than the decrease in wire delay from B1 to C1. Such scenarios could require further design iteration to achieve timing closure.

SUMMARY OF THE INVENTION

The preferred embodiment of the invention relates to a method for identifying and quantifying the situation where a circuit placement leads to unnecessary wire length which can be reduced without increasing the length of any pin to pin connections of that circuit, thus freeing up wiring tracks with no impact to timing.

The invention provides a method for identifying circuits in a region of wiring congestion whose placement can be modified in order to reduce net length on each of their net connections without increasing the length of any particular pin to pin segment. The method includes determining the placement locations of all the circuits connected to a particular circuit, excluding the coordinates of that circuit itself. A rectangle is then defined by the X min, Y min, X max, and Y max of these placement coordinates, and the placement of the circuit in question is checked to see if it falls within that rectangle. If not, the rectilinear distance from the circuit to the rectangle is calculated along with the closest placement location along the border of the rectangle. By replacing the circuit along the rectangle border at the location closest to the original circuit position, it is assured that no pin to pin segment will see an increase in length. The circuit instance name is reported along with the distance to the rectangle and recommended placement location. The chip designer can then use this information to decide which circuits to move and quickly replace them with minimal disruption to other circuit placements and no adverse impact on timing. In comparison to a placement or optimization run such as those previously described on the whole chip or a portion of the chip, there is less design change. This is a particularly advantageous in the latter stages of the design cycle, where typically manual logic and physical modifications have already been and are currently being implemented to compensate for deficiencies in the automated processes described and it is desired to minimize the impact to the design parameters those modifications were based on.

These and other improvements are set forth in the following detailed description. For a better understanding of the invention with advantages and features, refer to the description and to the drawings.

Our detailed description explains the preferred embodiments of our invention, together with advantages and features, by way of example with reference to the drawings.

DETAILED DESCRIPTION OF THE INVENTION

Figure 1:
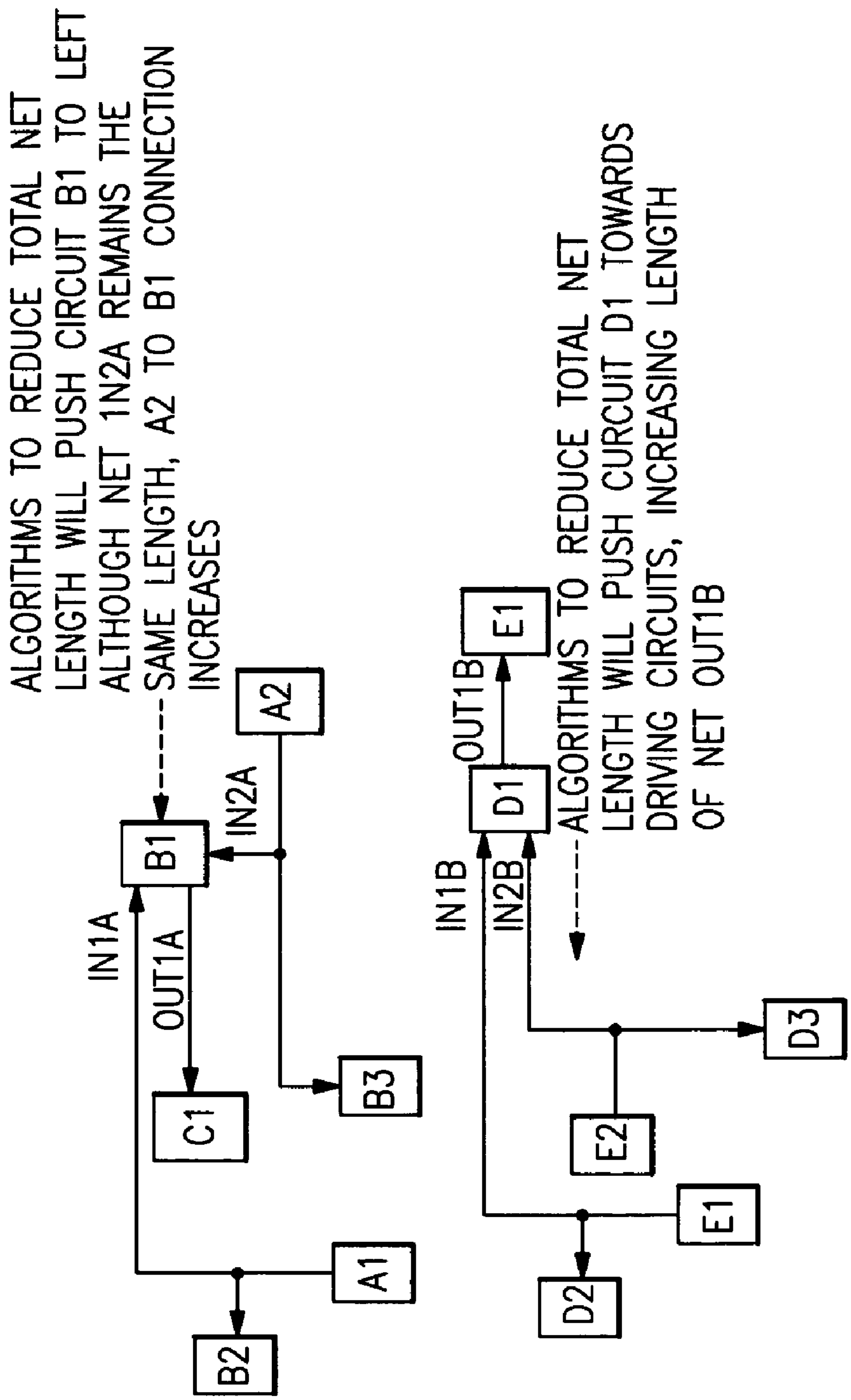
FIG. 1 illustrates how algorithms aimed at reducing total net length can increase pin to pin connections and hence impact timing.
Figure 2:
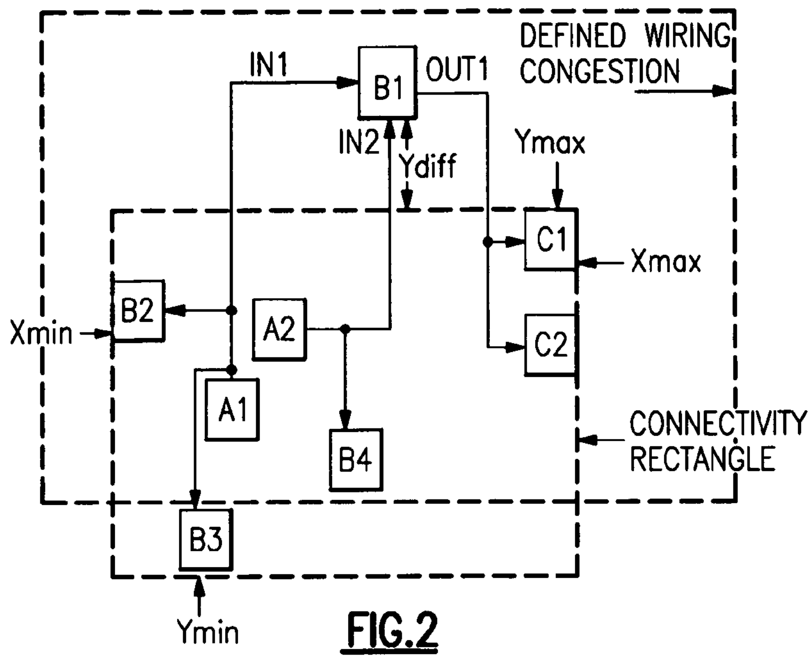
FIG. 2 illustrates how the circuits under consideration and their associated rectangles of connectivity are established.
Figure 4:
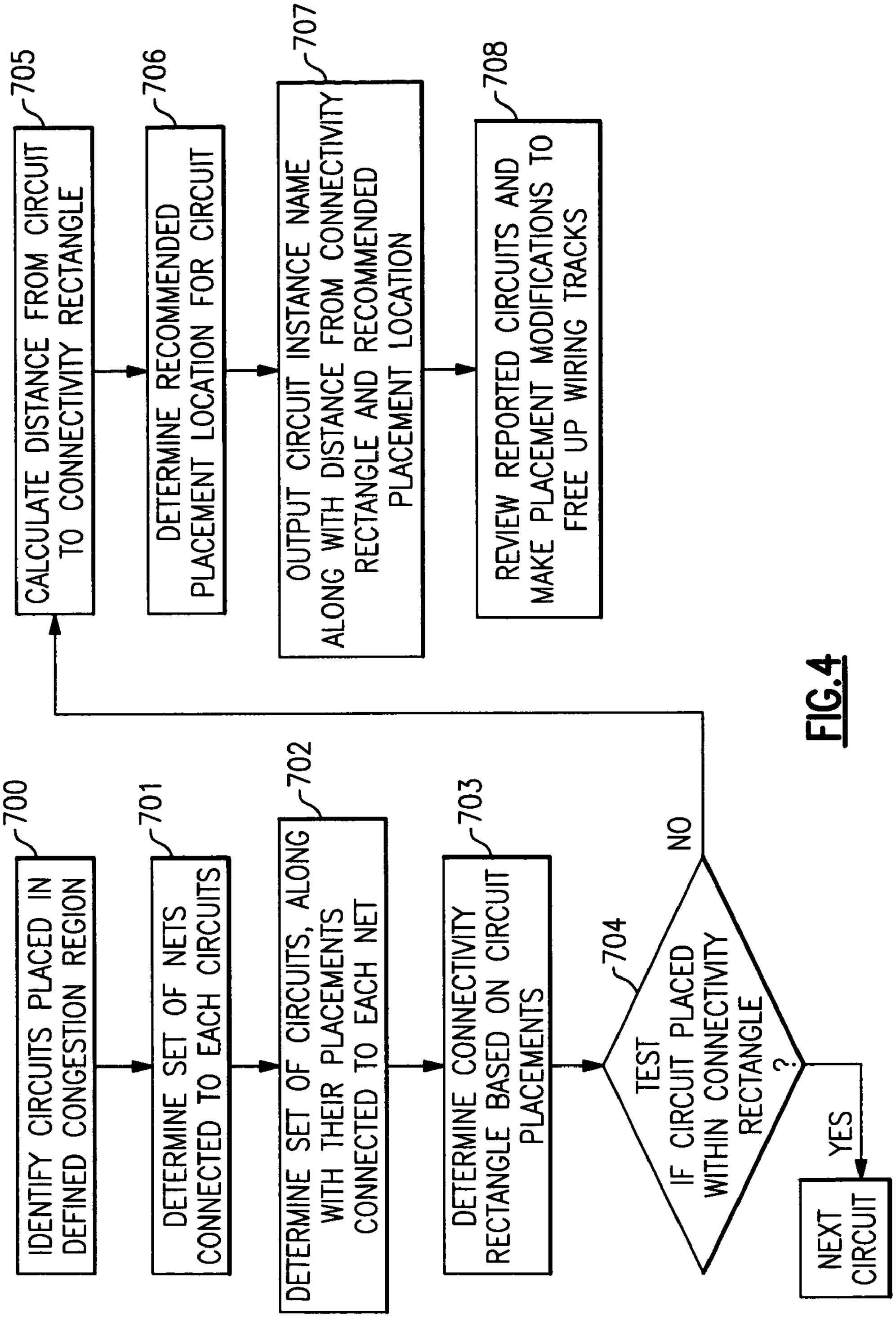
FIG. 4 is a flow diagram of the process steps of the preferred embodiment of the invention.

FIG. 4 is a flow diagram describing the process steps of the preferred embodiment. Initially, a region of wiring congestion is defined and described by a set of rectangular coordinates. At step 700, circuits in the design are tested to determine the set of circuits whose placement falls within the congestion region. Referring to FIG. 2, this would include all the circuits shown with the exception of B3. For each circuit instance in that set, at step 701, a program is used to determine the set of net names connected to that circuit. For example, in FIG. 2, if circuit B1 is the current circuit under consideration, nets IN1, IN2, and OUT1 will then be the set of nets connected to B1. This data is output in a format such that the relationship between B1 and nets IN1, IN2 and OUT1 is denoted, call it the circuit info file. At step 702, the nets in this output are then run through a program which finds the circuit instance names attached to each net along with their placement location. For net IN2 in FIG. 2, this would be circuits A2, B4 and B1. This data is output in a format such that the relationship between net name and connected circuits is maintained, call it the net info file.

At step 703, a program is used to correlate each circuit and its associated nets from the circuit info file with the circuits that connect with those nets in the net info file. At this point, we now have all the circuits which connect to the originally identified circuits (the result of step 700) along with their placement locations. For the example in FIG. 2, this would be circuit B1 connected to circuits A1, A2, B2, B3, B4, C1 and C2. For each originally identified circuit, the placement locations of its set of connected circuits are analyzed to determine the X min, Y min, X max and Y max. In FIG. 2, circuit B2 defines the X min, C1 defines the Y max, C1 and C2 define the X max and B3 defines the Y min. These coordinates are used to define a rectangle of connectivity, shown by the dashed line marked "Connectivity Rectangle" in FIG. 2.

Figure 3:
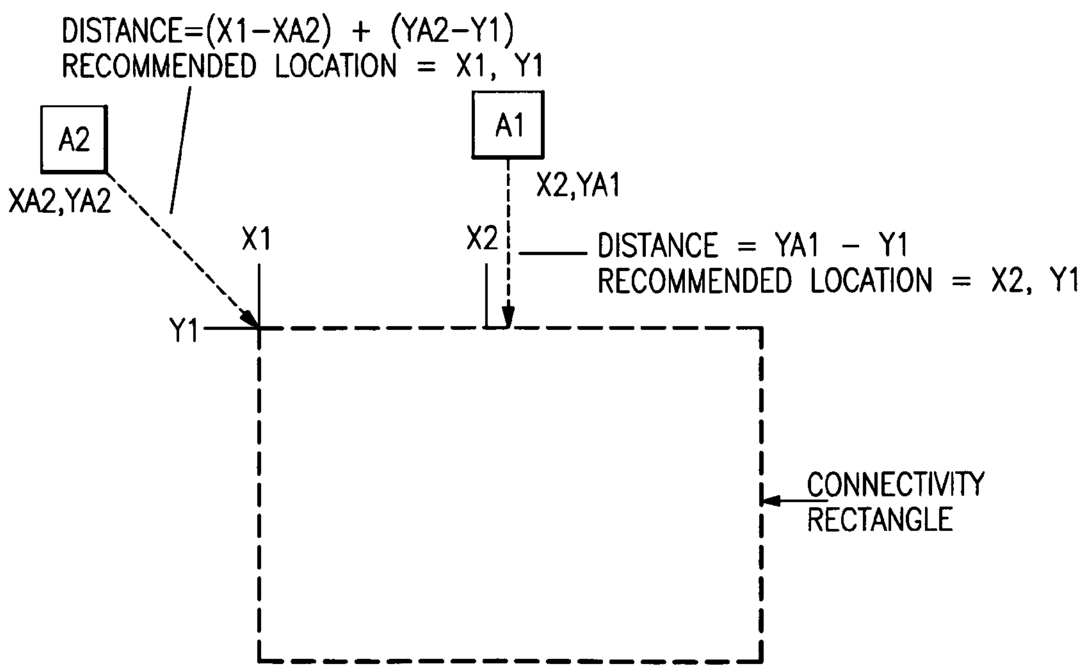
FIG. 3 illustrates the determination of the recommended placement location for a circuit outside its rectangle of connectivity.

At step 704, each originally identified circuit is then checked to determine if its placement falls within its associated rectangle of connectivity. If it does not, at step 705 the rectilinear distance from the circuit to the rectangle is calculated. Referring to FIG. 3, assuming the connectivity rectangle shown applies to both circuits A1 and A2, for circuit A1 this distance corresponds to a straight drop from Y coordinate YA1 to the northern border of the rectangle at Y=Y1 for a length of YA1−Y1. For circuit A2, this corresponds to an X distance of X1−XA2 plus a Y distance of Y1−YA2. At step 706, a recommended placement location for each circuit is determined based on the closest point along the rectangle edge to the circuit. In FIG. 3., the recommended placement location for circuit A1 would be point X2, Y1 along the rectangle and for circuit A2 it would be the corner of the rectangle at X1, Y1. By modifying the circuit's placement to this position, all net connections associated with the circuit are reduced in length by the distance to the rectangle and no pin to pin connection can be increased as all pins connected to the circuit lie within the rectangle. Referring back to FIG. 2., if circuit B1 is replaced at its recommended location straight down along the northern border of the rectangle, nets IN1, IN2, and OUT1 as well as all pin to pin segments are reduced by the length Ydiff, thus freeing up wiring tracks with only the possibility of decreasing path delays.

The circuit instances lying outside their rectangle of connectivity are reported at step 707 along with their current placement, distance from the rectangle, and recommended placement location. At step 708, this information is used at the chip designer's discretion to determine the circuit placement modifications which will be implemented and aid in the replacing of the selected circuits.

By using this process to identify and replace circuits, not only are the path delays encompassing the circuits reduced but wiring tracks are freed up to aid in alleviating wiring congestion and increase the probability of non-related nets routing in with minumum wire length.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for identifying, in a VLSI chip design, one or more circuits placed in a region of wiring congestion which can be replaced such that all associated pin to pin connections are reduced in length, including the steps of:

(a) identifying one or more circuits in a region of wiring congestion whose placement can be modified in order to reduce net length on each of said circuits' net connections without increasing the length of any particular pin to pin segment and determining placement locations of all the circuits connected to a particular circuit, excluding the coordinates of that particular circuit itself, within the region of wiring congestion without increasing the length of any pin to pin connections of said that particular circuit of each of said circuits; and (b) for each of said circuits in step (a), determining placements of all circuits to which each of said circuits is connected; and (c) for each of said circuits in step (a), determining whether each of said circuits lie outside a connectivity rectangle corresponding to the circuits to which it connects.

2. The method as in claim 1, in which step (a) further comprises testing circuit placements to determine if said placements fall within a user defined rectangle of wiring congestion.

3. The method as in claim 1, in which step (b) further comprises determining nets connected to said each of said circuits and further determining said all circuits, along with their placement locations, attached to each of said nets.

4. The method as in claim 1, in which step (c) further comprises determining Xmin, Xmax, Ymin and Ymax values of placement locations of all the circuits connected to each of said circuits, and using those said values to define said connectivity rectangle for said each of said circuits, wherein Xmin, Xmax, Ymin, and Ymax values are respectively minimum and maximum values of X-coordinates and Y-Coordinates of said placement locations.

5. The method of claim 4, further comprising a step of testing each of said circuit placements to determine if it lies outside its associated connectivity rectangle.

6. The method of claim 4, further comprising a step of calculating a rectilinear distance from said each of said circuits to a closest border of the connectivity rectangle if said each of said circuits lies outside the rectangle and replacing one or more of said circuits along the rectangle border at a location closest to an original circuit position, such that no pin to pin segment will see an increase in length.

7. The method of claim 6, further comprising a step of determining a recommended placement location of said each of said circuits such that all pin to pin connections associated with said each of said circuits are reduced.

8. The method of claim 7, further comprising a step of reporting said circuits placed outside their rectangle of connectivity along with said rectilinear distance and said recommended placement location.

* * * * *